(12) United States Patent
Kim

(10) Patent No.: US 7,030,643 B2
(45) Date of Patent: Apr. 18, 2006

(54) OUTPUT BUFFER CIRCUITS INCLUDING LOGIC GATES HAVING BALANCED OUTPUT NODES

(75) Inventor: Joung-yeal Kim, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 59 days.

(21) Appl. No.: 10/701,321

(22) Filed: Nov. 4, 2003

(65) Prior Publication Data

US 2004/0090243 A1 May 13, 2004

(30) Foreign Application Priority Data

Nov. 4, 2002 (KR) ................. 10-2002-0067745

(51) Int. Cl.
 *H03K 19/003* (2006.01)
(52) U.S. Cl. ................. 326/27; 326/26; 326/57; 326/83
(58) Field of Classification Search ............ 326/23–24, 326/26–27, 56–58, 82–83; 327/108, 112

See application file for complete search history.

(56) References Cited

U.S. PATENT DOCUMENTS

| 6,229,336 B1 | 5/2001 | Felton et al. | |
| 6,255,867 B1 * | 7/2001 | Chen | 327/108 |
| 6,329,840 B1 * | 12/2001 | Moyal | 326/58 |

FOREIGN PATENT DOCUMENTS

| JP | 11202970 | 7/1999 |

OTHER PUBLICATIONS

Rhyne, 1973, Fundamentals of Digital Systems Design, N.J., pp. 70-71.*
Korean Office Action for Application No. 10-2002-0067745.
English Translation of Korean Office Action for Application No. 10-2002-0067745.
Logic Gates-Digital Logic Circuits "Truth Table for the "NOR" Gate"; http://www.autoshop101.com/trainmodules/logicgate/127.html, no date.
Logic Gates-Digital Logic Circuits "Truth Table for the "NAND" Gate"; http://www.autoshop101.com/trainmodules/logicgat/121.html, no date.

* cited by examiner

*Primary Examiner*—Anh Q. Tran
(74) *Attorney, Agent, or Firm*—Myers Bigel Sibley & Sajovec

(57) ABSTRACT

A buffer circuit may include an output terminal, a pull-up transistor, a pull-down transistor, and first and second logic gates. The pull-up transistor is connected between the output terminal and a supply voltage, and the pull-up transistor pulls the output terminal up to the supply voltage responsive to a pull-up control signal. The pull-down transistor is connected between the output terminal and a reference voltage, and the pull-down transistor pulls the output terminal down to the reference voltage responsive to a pull-down control signal. The first logic gate may generate the pull-up control signal at a first output node responsive to a control signal and a data signal, and the first logic gate may include a plurality of serially connected transistors in an electrical path between the supply voltage and the first output node. The second logic gate may generate the pull-down control signal at a second output node responsive to the data signal and an inverse of the control signal, and the second logic gate may include a plurality of serially connected transistors in a path between the supply voltage and the second output node.

30 Claims, 8 Drawing Sheets

OUTPUT BUFFER CIRCUITS INCLUDING LOGIC GATES HAVING BALANCED OUTPUT NODES

RELATED APPLICATIONS

This application claims the priority of Korean Patent Application No. 2002-67745 filed 4 Nov. 2002, in the Korean Intellectual Property. Office, the disclosure of which is incorporated herein in its entirety by reference.

BACKGROUND OF THE INVENTION

1. Field of the Invention

The present invention relates to semiconductor devices, and more particularly, to output buffers for semiconductor devices and related methods.

2. Description of the Related Art

A semiconductor device may use a buffer circuit to drive relatively high current loads. In particular, a circuit which drives an output pin on which a relatively high current load is weighed may be referred to as an output buffer circuit. FIG. 1 is a circuit diagram of a conventional output buffer circuit which receives a control signal CNT, and FIG. 2 is a circuit diagram of a conventional output buffer which receives two control signals CNT1 and CNT2. The conventional output buffer circuits shown in FIGS. 1 and 2 include a pull-up transistor 11, a pull-down transistor 13, a NAND gate 15 (or 25) which drives the pull-up transistor 11, and a NOR gate 17 (or 27) which drives the pull-down transistor 13, respectively.

In the case of a conventional output buffer circuit, it may be important to maintain characteristics of the NAND gate 15 (or 25) as equivalent to those of the NOR gate 17 (or 27) to reduce an occurrence of a high/low skew of data output via an output pin DQ. Such a conventional output buffer circuit may be designed in which sizes of transistors are adjusted so that the NAND gate 15 (or 25) has characteristics approximately the same as the NOR gate 17 (or 27). Nonetheless, characteristics of the NAND gate 15 (or 25) may be different from those of the NOR gate 17 (or 27) if there are changes in process, voltage, and/or temperature (PVT).

Moreover, when data is divided into some parts and input to the NAND gate 15 (or 25) and the NOR gate 17 (or 27), differences between input capacitances of the NAND gate 15 (or 25) and the NOR gate 17 (or 27) may become relatively large and thus characteristics of the NAND gate may be significantly different from characteristics of the NOR gate due to changes in PVT. A skew of data output via the output pin DQ may thus increase.

SUMMARY OF THE INVENTION

According to embodiments of the present invention, a buffer circuit may include an output terminal, a pull-up transistor, a pull-down transistor, a first logic gate, and a second logic gate. The pull-up transistor may be connected between the output terminal and a supply voltage, and the pull-up transistor may pull the output terminal up to the supply voltage responsive to a pull-up control signal. The pull-down transistor may be connected between the output terminal and a reference voltage, and the pull-down transistor may pull the output terminal down to the reference voltage responsive to a pull-down control signal. The first logic gate may generate the pull-up control signal at a first output node responsive to a control signal and the data signal. More particularly, the first logic gate may include a plurality of serially connected transistors in an electrical path between the supply voltage and the first output node. The second logic gate may generate the pull-down control signal at a second output node responsive to the data signal and an inverse of the control signal. More particularly, the second logic gate may include a plurality of serially connected transistors in a path between the supply voltage and the second output node. According to particular embodiments, the plurality of serially connected transistors between the supply voltage and the first output node and the plurality of serially connected transistors between the supply voltage and the second output node may include exactly a same number of serially connected transistors.

In addition, the predetermined number of serially connected transistors in the electrical path between the supply voltage and the first output node may include a first transistor having a first control electrode connected to the data signal and a second transistor coupled in series between the supply voltage and the first transistor. The first logic gate may also include a third transistor connected in parallel with the first transistor between the second transistor and the first output node, with the third transistor having a control electrode connected to the control signal. For example, the transistors may be field effect transistors, and the control electrodes may be gate electrodes.

Moreover, each of the first, second and third transistors may have a same conductivity type. For example, the first transistor may be a first PMOS transistor, the second transistor may be a second PMOS transistor, and the third transistor may be a third PMOS transistor. The plurality of serially connected transistors in the path between the supply voltage and the second output node may thus be PMOS transistors. In addition, the first logic gate may include a plurality of serially connected NMOS transistors between the first output node and the reference voltage. More particularly, the plurality of serially connected NMOS transistors may include a first NMOS transistor having a first NMOS control electrode connected to the data signal and a second NMOS transistor having a second NMOS control electrode connected to the control signal. The first logic gate may also include a third NMOS transistor connected with the first output node, with the third NMOS transistor having a third NMOS control electrode connected to the reference voltage.

The first and second logic gates may also be responsive to a second control signal, with the first logic gate further including a fourth transistor connected in parallel with the first and third transistors between the second transistor and the first output node, and having a control electrode connected to the second control signal. The first logic gate may also include a fifth transistor connected in series with the second transistor between the first transistor and the supply voltage. Accordingly, the plurality of serially connected transistors in the electrical path between the supply voltage and the first output node may be three serially connected transistors. The reference voltage may be a ground voltage, the first logic gate may be a NAND gate, and the second logic gate may be a NOR gate.

According to additional embodiments of the present invention, an output buffer may include an output terminal, a pull-up transistor, a pull-down transistor, a first logic gate, and a second logic gate. The pull-up transistor may be connected between the output terminal and a supply voltage, and the pull-up transistor may pull the output terminal up to the supply voltage responsive to a pull-up control signal. The pull-down transistor may be connected between the output terminal and a reference voltage, and the pull-down transistor may pull the output terminal down to the reference voltage responsive to a pull-down control signal. The first logic gate may generate the pull-up control signal at a first output node responsive to a control signal and a data signal, and the first logic gate may include a plurality of serially connected transistors in a path between the first output node and the reference voltage. The second logic gate may generate the pull-down control signal at a second output node responsive to the data signal and the inverse of the control signal, and the second logic gate may include a plurality of serially connected transistors in a path between the second output node and the reference voltage. According to particular embodiments, the plurality of serially connected transistors between the reference voltage and the first output node and the plurality of serially connected transistors between the reference voltage and the second output node may include exactly a same number of serially connected transistors.

The plurality of serially connected transistors in the electrical path between the second output node and the reference voltage may include a first transistor having a first control electrode connected to the data signal and a second transistor connected in series between the first transistor and the reference voltage. Moreover, the second logic gate may also include a third transistor connected in parallel with the first transistor between the second transistor and the second output node, with the third transistor having a control electrode connected to the inverse of the control signal. More particularly, each of the first, second and third transistors may have a same conductivity type. For example, the transistors may be field effect transistors, and the control electrodes may be gate electrodes.

More particularly, the first transistor may be a first NMOS transistor, the second transistor may be a second NMOS transistor, and the third transistor may be a third NMOS transistor. In addition, the predetermined number of serially connected transistors in the path between the first output node and the reference voltage may be NMOS transistors. Moreover, the second logic gate may include a plurality of serially connected PMOS transistors between the supply voltage and the second output node, and the plurality of serially connected PMOS transistors may include a first PMOS transistor having a first PMOS control electrode connected to the data signal and a second PMOS transistor having a second PMOS control electrode connected to the inverse of the control signal. The second logic gate may also include a third PMOS transistor connected with the first output node, the third PMOS transistor having a third PMOS control electrode connected to the reference voltage.

The first and second logic gates may be further responsive to a second control signal in addition to the first control signal. Accordingly, the second logic gate may further include a fourth transistor connected in parallel with the first and third transistors between the second transistor and the second output node, with the fourth transistor having a control electrode connected to an inverse of the second control signal. A fifth transistor may also be connected in series with the second transistor between the first transistor and the reference voltage. Accordingly, the plurality of serially connected transistors in the electrical path between the second output node and the reference voltage may be three serially connected transistors.

In addition, the reference voltage may be a ground voltage, the first logic gate may be a NAND gate, and the second logic gate may be a NOR gate. Moreover, the plurality of serially connected transistors in the path between the first output node and the reference voltage may be NMOS transistors. Similarly, the plurality of serially connected transistors in the path between the second output node and the reference voltage may be NMOS transistors.

According to still additional embodiments of the present invention, a buffer circuit may include an output terminal, a pull-up transistor, a pull-down transistor, a first logic gate, and a second logic gate. The pull-up transistor may be connected between the output terminal and a supply voltage, and the pull-up transistor may pull the output terminal up to the supply voltage responsive to a pull-up control signal. The pull-down transistor may be connected between the output terminal and a reference voltage, and the pull-down transistor may pull the output terminal down to the reference voltage responsive to a pull-down control signal. The first logic gate may generate the pull-up control signal at a first output node responsive to a control signal and a data signal. More particularly, the first logic gate may include first and second transistors connected in parallel between the supply voltage and the first output node and third and fourth transistors connected in parallel between the first output node and the reference voltage. The second logic gate may generate the pull-down control signal at a second output node responsive to the data signal and an inverse of the control signal.

More particularly, the first and second transistors may be PMOS transistors, and the third and fourth transistors may be NMOS transistors. Moreover, a first control electrode of the first transistor may be connected to the data signal, a second control electrode of the second transistor may be connected to the control signal, a third control electrode of the third transistor may be connected to the data signal, and a fourth control electrode of the fourth transistor may be connected to the supply voltage. The first logic gate may also include a fifth transistor connected in parallel with the first and second transistors between the supply voltage and the first output node, and the fifth transistor may be a PMOS transistor having a control electrode connected to a second control signal.

The first logic gate may further include a fifth transistor coupled in series between the supply voltage and the first and second transistors, and a sixth transistor coupled in series between the reference voltage and the third and fourth transistors. In addition, the second logic gate may include fifth and sixth transistors connected in parallel between the supply voltage and the second output node and seventh and eighth transistors connected in parallel between the second output node and the reference voltage. Moreover, the first and second and fifth and sixth transistors may be PMOS transistors, and the second and third and seventh and eighth transistors may be NMOS transistors.

In addition, a first control electrode of the first transistor may be connected to the data signal, a second control electrode of the second transistor may be connected to the control signal, a third control electrode of the third transistor may be connected to the data signal, and a fourth control electrode of the fourth transistor may be connected to the reference voltage. Furthermore, a fifth control electrode of the fifth transistor may be connected to the data signal, a sixth control electrode of the sixth transistor may be connected to the supply voltage, a seventh control electrode of the seventh transistor may be connected to the data signal, and an eighth control electrode of the eighth transistor may be connected to the inverse of the control signal.

According to yet additional embodiments of the present invention, a buffer circuit may include an output terminal, a pull-up transistor, a pull-down transistor, a first logic gate, and a second logic gate. The pull-up transistor may be connected between the output terminal and a supply voltage, and the pull-up transistor may pull the output terminal up to the supply voltage responsive to a pull-up control signal. The pull-down transistor may be connected between the output terminal and a reference voltage, and the pull-down transistor may pull the output terminal down to the reference voltage responsive to a pull-down control signal. The first logic gate may generate the pull-up control signal at a first output node responsive to a control signal and a data signal. The second logic gate may generate the pull-down control signal at a second output node responsive to the data signal and an inverse of the control signal. Moreover, the second logic gate may include first and second transistors connected in parallel between the supply voltage and the second output node and third and fourth transistors connected in parallel between the first output node and the reference voltage.

The first and second transistors may be PMOS transistors, and the third and fourth transistors may be NMOS transistors. More particularly, a first control electrode of the first transistor may be connected to the data signal, a second control electrode of the second transistor may be connected to the supply voltage, a third control electrode of the third transistor may be connected to the data signal, and a fourth control electrode of the fourth transistor may be connected to the inverse of the control signal. In addition, the second logic gate may include a fifth transistor connected in parallel with the first and second transistors between the supply voltage and the second output node, and the fifth transistor may be a PMOS transistor having a control electrode connected to an inverse of a second control signal. The second logic gate may also include a fifth transistor coupled in series between the supply voltage and the first and second transistors, and a sixth transistor coupled in series between the reference voltage and the third and fourth transistors.

The first logic gate may include fifth and sixth transistors connected in parallel between the supply voltage and the first output node and seventh and eighth transistors connected in parallel between the first output node and the reference voltage. Moreover, the first and second and fifth and sixth transistors may be PMOS transistors, and the second and third and seventh and eighth transistors may be NMOS transistors.

In addition, a first control electrode of the first transistor may be connected to the data signal, a second control electrode of the second transistor may be connected to the supply voltage, a third control electrode of the third transistor may be connected to the data signal, and a fourth control electrode of the fourth transistor may be connected to an inverse of the control signal. Furthermore, a fifth control electrode of the fifth transistor may be connected to the data signal, a sixth control electrode of the sixth transistor may be connected to the control signal, a seventh control electrode of the seventh transistor may be connected to the data signal, and an eighth control electrode of the eighth transistor may be connected to the reference voltage.

According to embodiments of the present invention, an output buffer circuit may reduce skew of output data resulting from changes in process, voltage, and/or temperature (PVT).

According to some embodiments of the present invention, an output buffer circuit may include a pull-up transistor, a pull-down transistor, a NAND gate, and a NOR gate. The pull-up transistor pulls up an output terminal in response to a pull-up control signal, and the pull-down transistor pulls down the output terminal in response to a pull-down control signal. The NAND gate receives at least one control signal and data and generates the pull-up control signal. The NOR gate receives the inverted control signal and the data, and generates the pull-down control signal. Moreover, a number of PMOS transistors present along a first path from a first supply voltage to an output terminal of the NAND gate may be equivalent to a number of PMOS transistors present along a second path from the first supply voltage to an output terminal of the NOR gate. In addition, a number of NMOS transistors present along a first path from a second supply voltage to an output terminal of the NAND gate may be equivalent to a number of NMOS transistors present along a second path from the second supply voltage to an output terminal of the NOR gate.

Therefore, in an output buffer circuit according to embodiments of the present invention, PMOS transistors in the NAND gate and the NOR gate can be fabricated to have a same size. Also, NMOS transistors may be fabricated to have a same size. As a result, input capacitances of the NAND gate and the NOR gate may be approximately equivalent. Accordingly characteristics of the NAND gate can be approximately equivalent to those of the NOR gate, thereby reducing a skew of data output at the output terminal.

DETAILED DESCRIPTION

The present invention will be described more fully hereinafter with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will also be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

Figure 1:
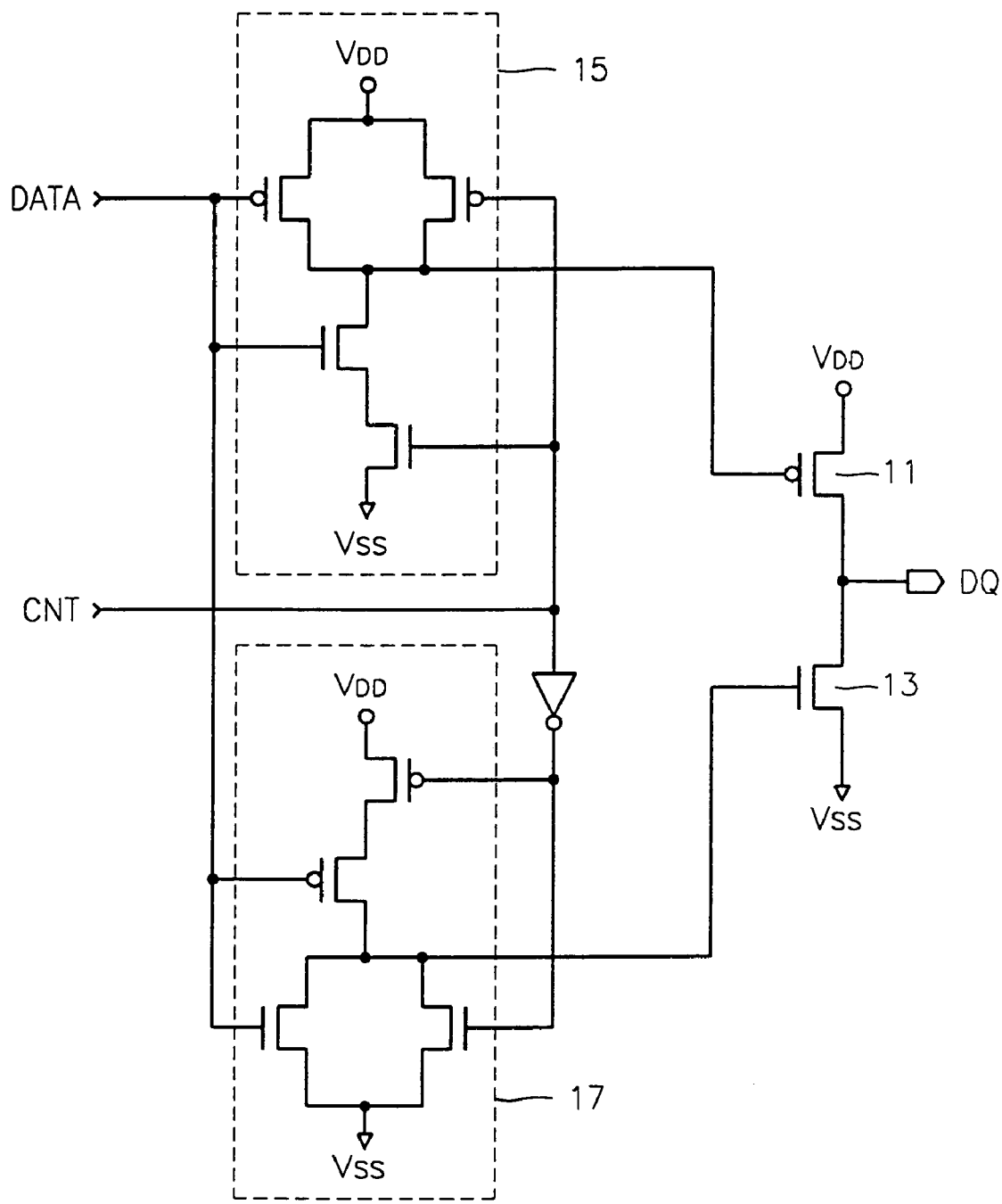
FIG. 1 is a circuit diagram of a conventional output buffer circuit which receives one control signal.
Figure 2:
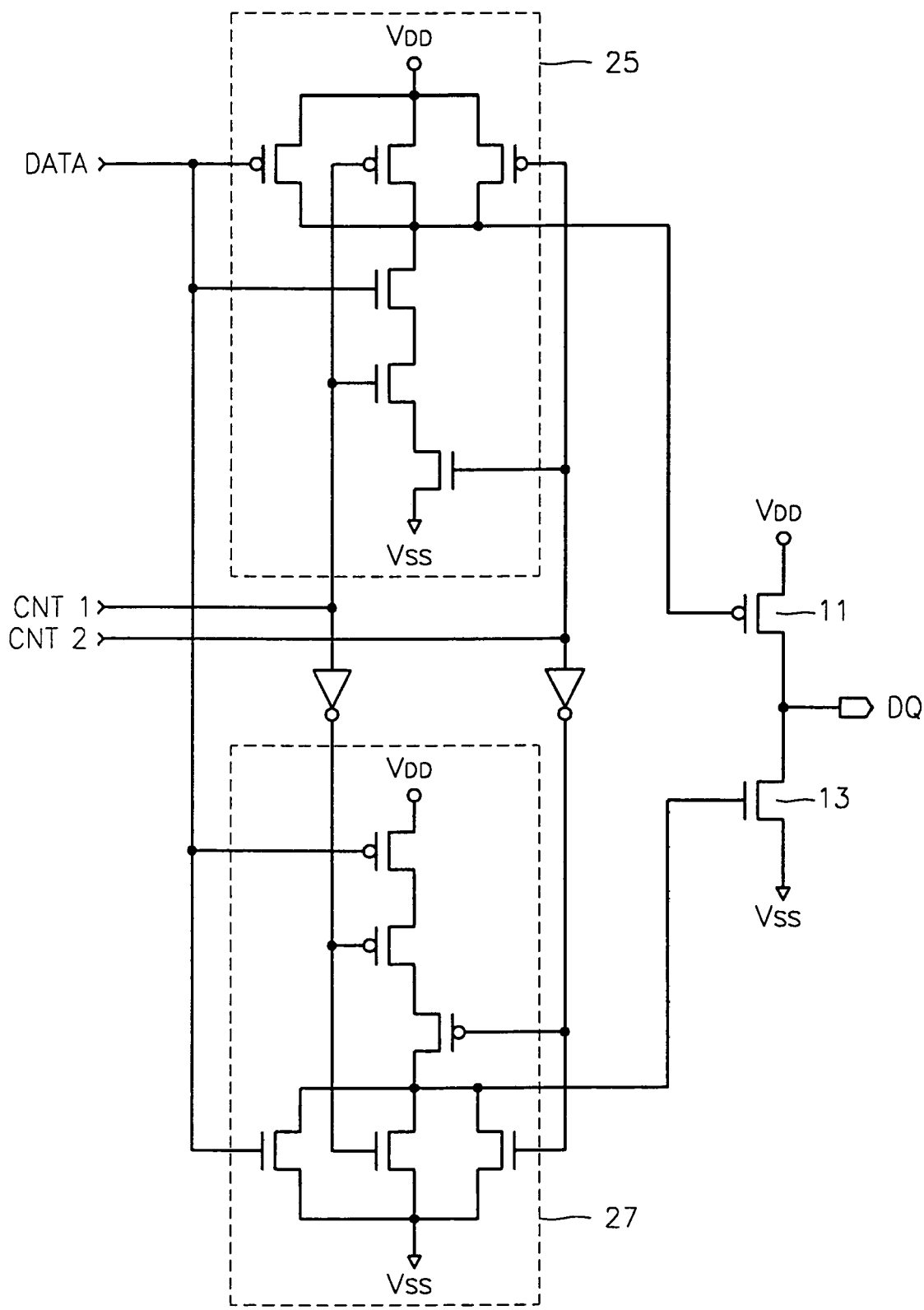
FIG. 2 is a circuit diagram of a conventional output buffer circuit which receives two control signals.
Figure 3:
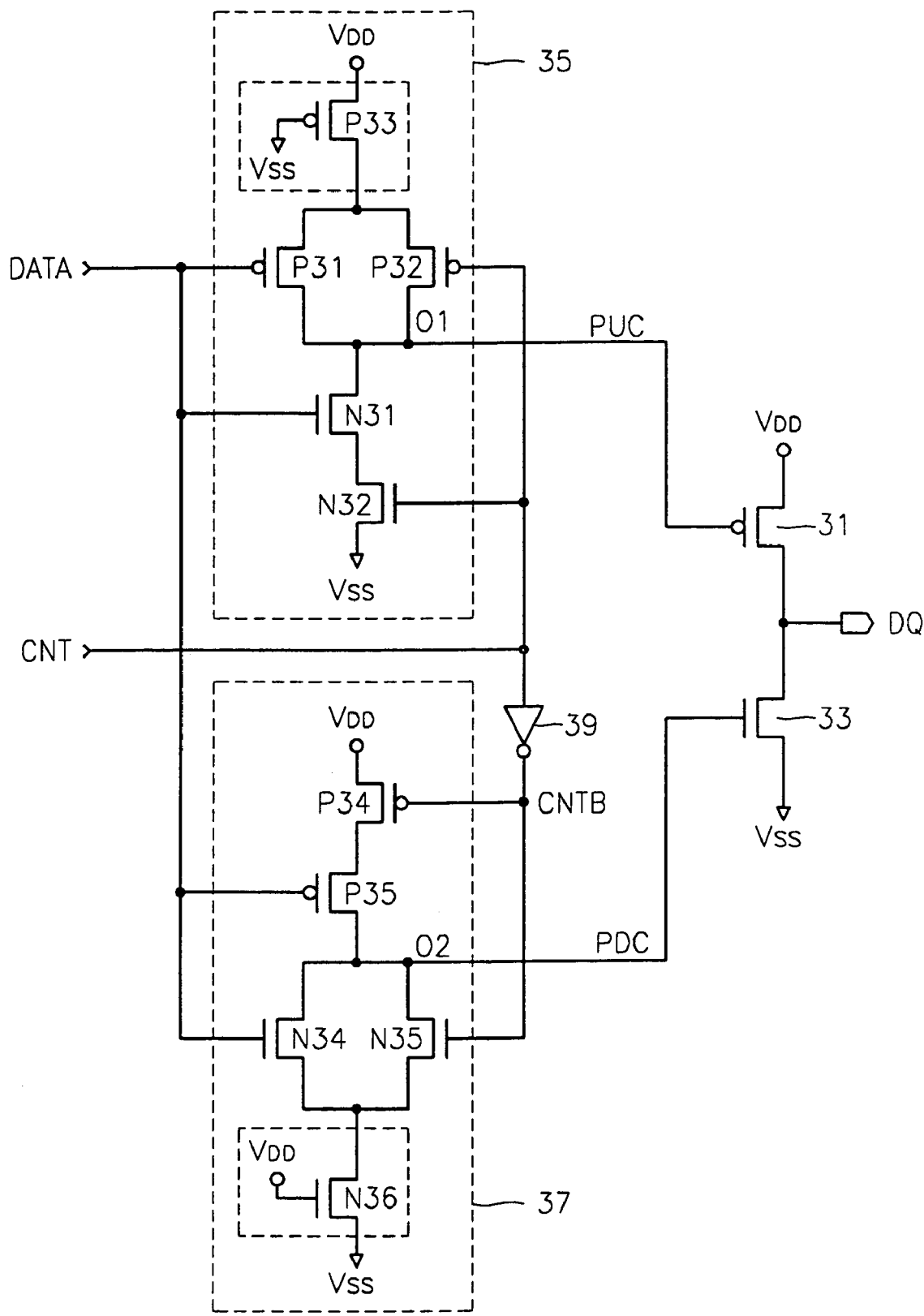
FIG. 3 is a circuit diagram of an output buffer circuit which receives a single control signal according to first embodiments of the present invention.

FIG. 3 is a circuit diagram of an output buffer circuit which receives a control signal CNT, according to first embodiments of the present invention. Referring to FIG. 3, the output buffer circuit includes a pull-up transistor 31, a pull-down transistor 33, a NAND gate 35, a NOR gate 37, and an inverter 39.

The pull-up transistor 31 pulls an output pin DQ (i.e., an output terminal) up to a supply voltage VDD in response to a pull-up control signal PUC, and the pull-down transistor 33 pulls the output terminal DQ down to a voltage VSS (such as a ground voltage) in response to a pull-down control signal PDC. The NAND gate 35 receives the control signal CNT and data signal DATA to generate the pull-up control signal PUC. The NOR gate 37 receives an inverse of the control signal CNT and the data signal DATA to generate the pull-down control signal PDC.

The NAND gate 35 includes a PMOS transistor P33, a PMOS transistor P31, a PMOS transistor P32, an NMOS transistor N31, and an NMOS transistor N32. The supply voltage VDD and the reference voltage VSS are connected to a source and gate of the PMOS transistor P33, respectively. A source of the PMOS transistor P31 is connected to a drain of the PMOS transistor P33, the data signal DATA is connected to a gate of the PMOS transistor P31, and a drain of the PMOS transistor P31 is connected to an output terminal O1 of the NAND gate 35. A source of the PMOS transistor P32 is connected to the drain of the PMOS transistor P33, the control signal CNT is connected to a gate of the PMOS transistor P32, and a drain of the PMOS transistor P32 is connected to the output terminal O1 of the NAND gate 35.

A drain of the NMOS transistor N31 is connected to the output terminal O1 of the NAND gate 35, and the data signal DATA is connected to a gate of the NMOS transistor N31. A drain of the NMOS transistor N32 is connected to a source of the NMOS transistor N31, the control signal CNT is connected to a gate of the NMOS transistor N32, and the reference voltage VSS is connected to a source of the NMOS transistor N32.

The NOR gate 37 includes a PMOS transistor P34, a PMOS transistor P35, an NMOS transistor N34, an NMOS transistor N35, and an NMOS transistor N36. The supply voltage VDD is connected to a source of the PMOS transistor P34, and the inverse CNTB of the control signal CNT is connected to a gate of the PMOS transistor P34. A source and drain of the PMOS transistor P35 are connected to a drain of the PMOS transistor P34 and an output terminal O2 of the NOR gate 37, respectively. The data signal DATA is connected to a gate of the PMOS transistor P35. A drain of the NMOS transistor N34 is connected to the output terminal O2 of the NOR gate 37 and the data signal DATA is connected to a gate of the NMOS transistor N34. A drain of the NMOS transistor N35 is connected to the output terminal O2 of the NOR gate 37, and the inverse CNTB of the control signal CNT is connected to the gate of the NMOS transistor N35. A drain of the NMOS transistor N36 is connected to a source of the NMOS transistor N34 and to a source of the NMOS transistor N35. The supply voltage VDD and the reference voltage VSS are connected to a gate and source of the NMOS transistor N36, respectively.

As mentioned above, in an output buffer circuit according to first embodiments of the present invention, two PMOS transistors are present along the path between the supply voltage VDD and the output terminal O1 of the NAND gate 35, and two PMOS transistors are present along the path between the supply voltage VDD and the output terminal O2 of the NOR gate 37. In other words, a number of PMOS transistors connected in series between the supply voltage VDD and the output terminal O1 of the NAND gate 35 is equivalent to a number of PMOS transistors connected in series between the supply voltage VDD and the output terminal O2 of the NOR gate 37.

Similarly, two NMOS transistors are present along the path between the reference voltage VSS and the output terminal O1 of the NAND gate 35, and two NMOS transistors are present along the path between the reference voltage VSS and the output terminal O2 of the NOR gate 37. In other words, a number of NMOS transistors connected in series between the output terminal O1 of the NAND gate 35 and the reference voltage VSS is equivalent to a number of NMOS transistors connected in series between the output terminal O2 of the NOR gate 37 and the reference voltage VSS.

Accordingly, PMOS transistors included in the NAND gate 35 and the NOR gate 37 can be fabricated to have approximately a same size (i.e. channel width), and further, NMOS transistors can also be also fabricated to have approximately a same size (i.e. channel width). Additionally, it is possible to fabricate the NAND gate 35 and the NOR gate 37 so that the input capacitance of the NAND gate 35 is approximately equivalent to that of the NOR gate 37. Thus, even if there are changes in process, voltage, and/or temperature (PVT), characteristics of the NAND gate 35 can be maintained to be approximately the same as those of the NOR gate 37 in an output buffer circuit according to first embodiments of the present invention, thereby reducing skew of data output via the output pin DQ.

Figure 4:
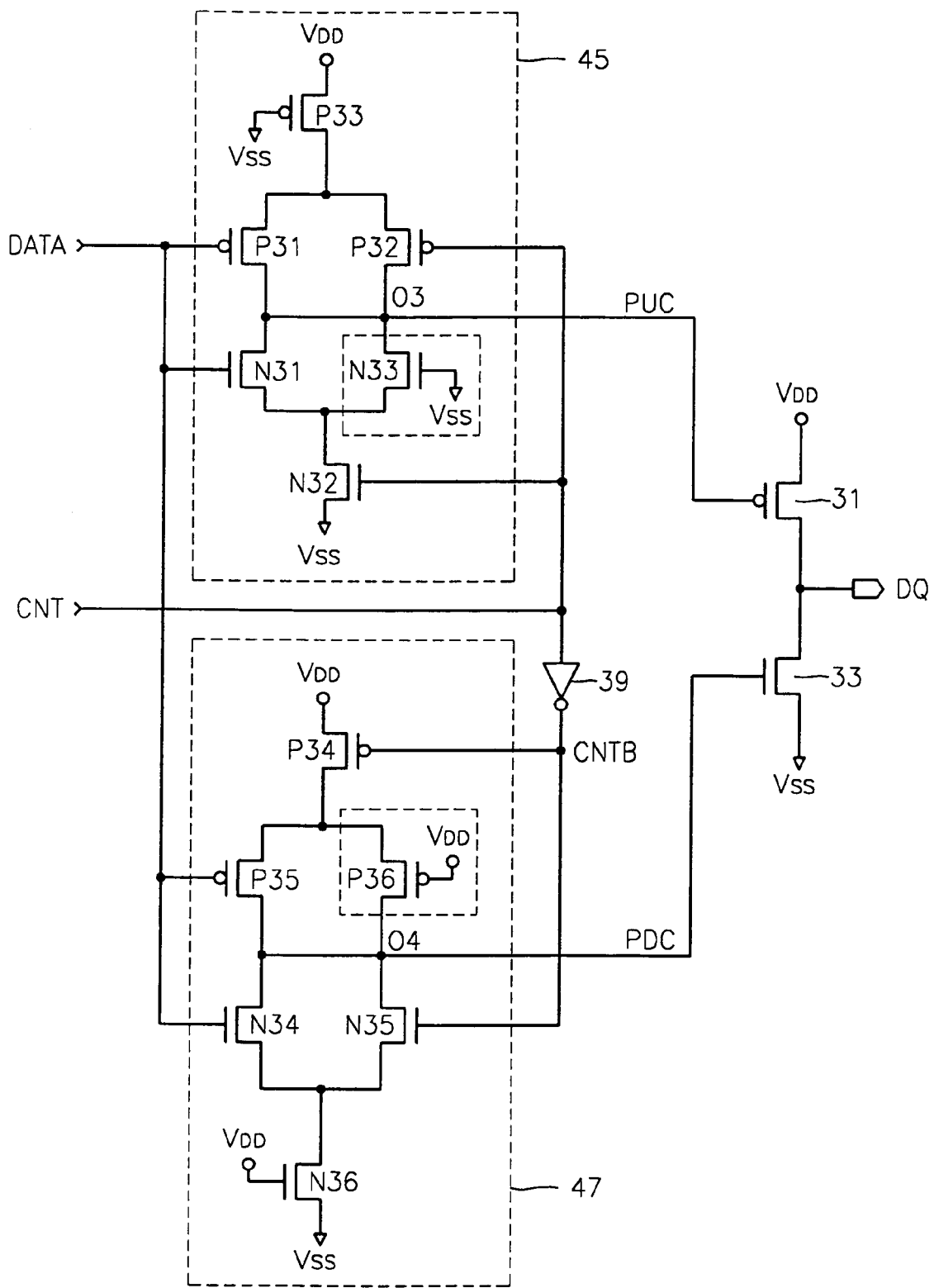
FIG. 4 is a circuit diagram of an output buffer circuit which receives a single control signal according to second embodiments of the present invention.

FIG. 4 is a circuit diagram of an output buffer circuit which receives a control signal CNT, according to second embodiments of the present invention. Referring to FIG. 4, a NAND gate 45 may include an NMOS transistor N33 in addition to the transistors (P31, P32, P33, N31, and N32) discussed above with respect to the NAND gate 35 of FIG. 3. A drain of the NMOS transistor N33 is connected to an output terminal O3 of the NAND gate 45, reference voltage VSS (such as a ground voltage) is connected to a gate of the NMOS transistor N33, and a source of the NMOS transistor N33 is connected to a source of an NMOS transistor N31. In addition a NOR gate 47 may include a PMOS transistor P36 in addition to the transistors (P34, P35, N34, N35, and N36) discussed above with respect to the NOR gate 37 of FIG. 3. A source of PMOS transistor P36 is connected to a drain of a PMOS transistor P34 and a drain of PMOS transistor P36 is connected to an output terminal O4 of the NOR gate 47. The supply voltage VDD is connected to a gate of the PMOS transistor P36.

In the output buffer circuit according to second embodiments of the present invention, a number of PMOS transistors connected to the output terminal O3 of the NAND gate 45 is equal to a number of PMOS transistors connected to the output terminal O4 of the NOR gate 47. Also, a number of NMOS transistors connected to the output terminal O3 of the NAND gate 45 is equal to a number of NMOS transistors connected to the output terminal O4 of the NOR gate 47. More particularly, two PMOS transistors and two NMOS transistors are connected to the output terminals O3 and O4, respectively. In addition, inner nodes of the NAND gate 45 may have approximately a same capacitance as inner nodes of the NOR gate 47.

For this reason, the capacitance of the output terminal O3 of the NAND gate 45 may be approximately equivalent to that of the output terminal O4 of the NOR gate 47. Accordingly, an equivalence of characteristics of the NAND gate 45 and the NOR gate 47 can be improved by adding NMOS transistor N33 and PMOS transistor P36.

Figure 5:
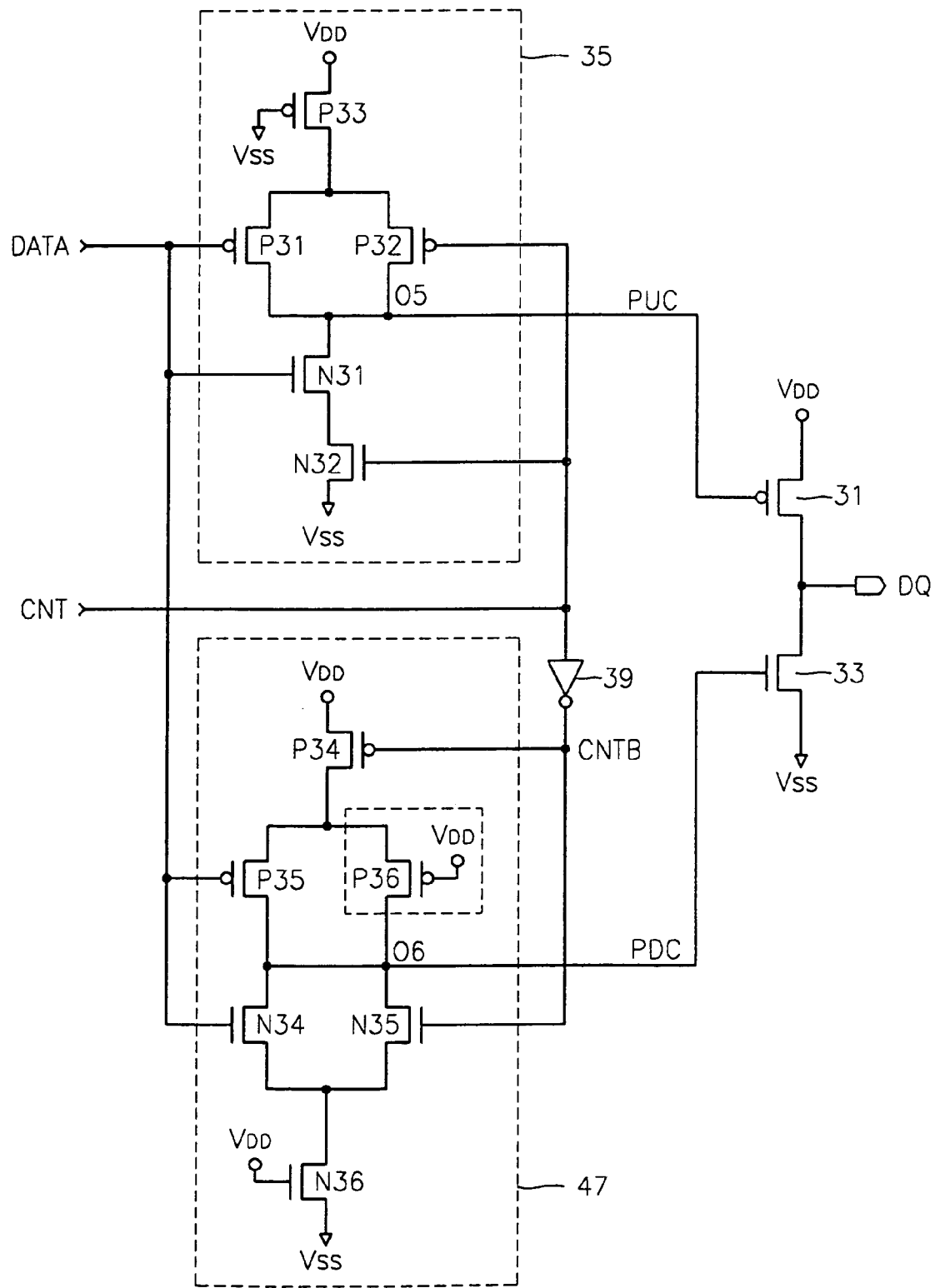
FIG. 5 is a circuit diagram of an output buffer circuit which receives a single control signal according to third embodiments of the present invention.

FIG. 5 is a circuit diagram of an output buffer circuit which receives a control signal CNT according to third embodiments of the present invention. The output buffer circuit of FIG. 5 includes a NAND gate 35 having a same structure as shown in FIG. 3 and a NOR gate 47 having a same structure as shown in FIG. 4.

In the output buffer circuit according to third embodiments of the present invention, both an output terminal O5 of the NAND gate 35 and an output terminal O6 of the NOR gate 47 are connected to two PMOS transistors P31 and P32 and two PMOS transistors P35 and P36, respectively. However, the output terminal O5 of the NAND gate 35 is connected to one NMOS transistor N32 while the output terminal O6 of the NOR gate 47 is connected to two NMOS transistors N34 and N35.

Therefore, a size (i.e. channel width) of the PMOS transistor P36 may be adjusted to maintain a capacitance of the output terminal O5 of the NAND gate 35 to be approximately the same as the capacitance of the output terminal O6 of the NOR gate 47. For example, if a size (i.e. channel width) of each of the PMOS transistors P31, P32, and P35 is 20 µm and a size (i.e. channel width) of each of the NMOS transistors N31, N34, and N35 is 8 µm, a desired size (i.e. channel width) of the PMOS transistor P36 may be determined to be 12 µm. Accordingly, an output buffer circuit according to third embodiments of the present invention may provide effects similar to those provided by second embodiments of the present invention discussed above with respect to FIG. 4.

Figure 6:
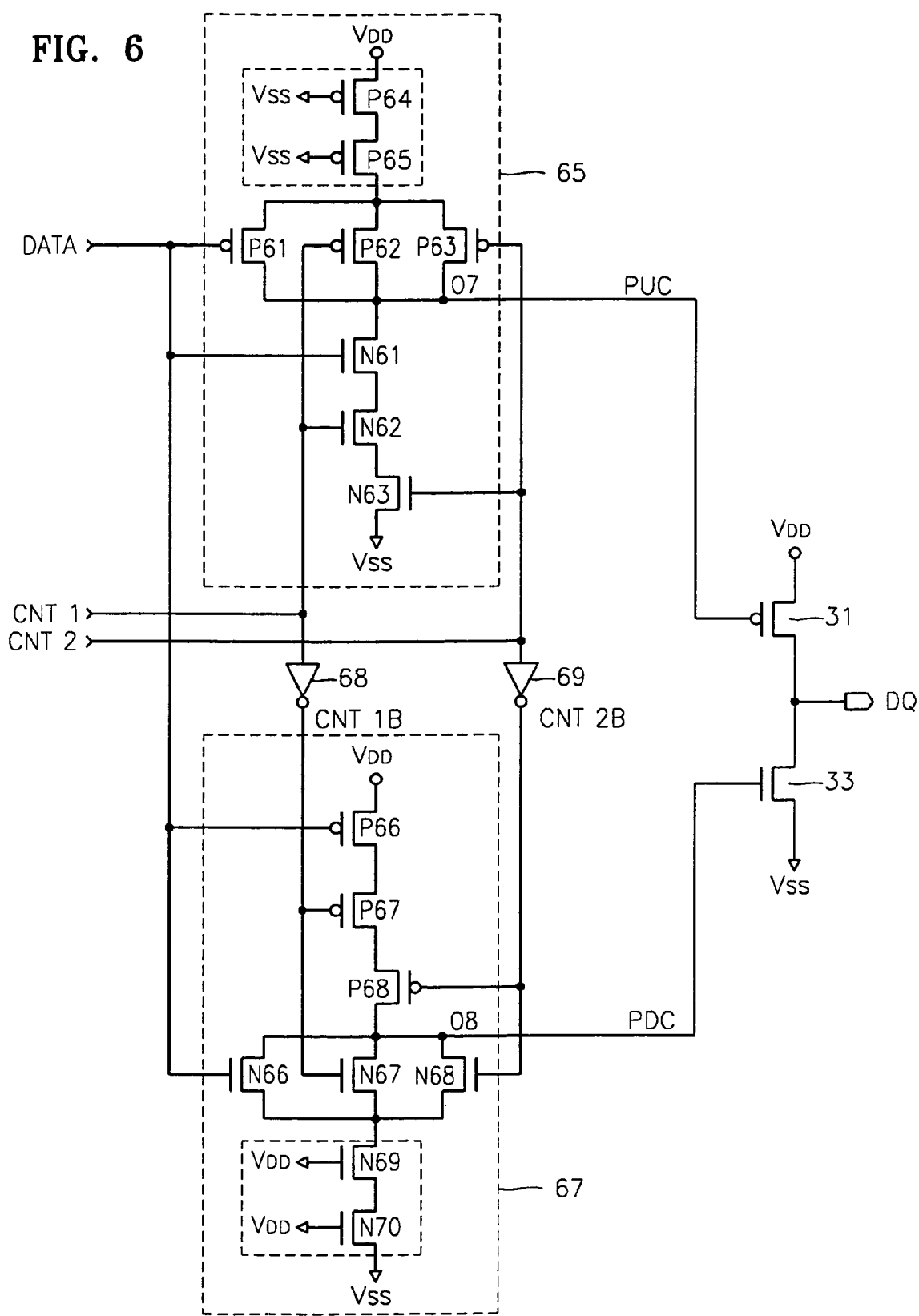
FIG. 6 is a circuit diagram of an output buffer circuit which receives two control signals according to fourth embodiments of the present invention.

FIG. 6 is a circuit diagram of an output buffer circuit which receives two control signals CNT1 and CNT2 according to fourth embodiments of the present invention. Referring to FIG. 6, the output buffer circuit according to fourth embodiments of the present invention includes a pull-up transistor 31, a pull-down transistor 33, a NAND gate 65, a NOR gate 67, and inverters 68 and 69.

The pull-up transistor 31 pulls an output pin DQ (i.e., an output terminal) up to the supply voltage VDD in response to a pull-up control signal PUC, and the pull-down transistor 33 pulls the output terminal DQ down to the reference voltage VSS in response to a pull-down control signal PDC. The NAND gate 65 receives the first and second control signals CNT1 and CNT2 and data signal DATA and generates the pull-up control signal PUC. The NOR gate 67 receives an inverse CNT1B of the first control signal CNT1, an inverse CNT2B of the second control signal CNT2, and the data signal DATA and generates the pull-down control signal PDC.

The NAND gate 65 includes PMOS transistors P61 through P65 and NMOS transistors N61 through N63. Supply voltage VDD and reference voltage VSS (such as a ground voltage) are connected to a source and gate of the PMOS transistor P64, respectively. A source of the PMOS transistor P65 is connected to a drain of the PMOS transistor P64, and the reference voltage, VSS is connected to a gate of the PMOS transistor P65. A source and drain of the PMOS transistor P61 are connected to a drain of the PMOS transistor P65 and the output terminal O7 of the NAND gate 65, respectively. The data signal DATA is connected to a gate of the PMOS transistor P61. A source and drain of the PMOS transistor P62 are connected to the drain of the PMOS transistor P65 and the output terminal O7 of the NAND gate 65, respectively. The first control signal CNT1 is connected to a gate of the PMOS transistor P62. A source and drain of the PMOS transistor P63 are connected to the drain of the PMOS transistor P65 and the output terminal O7 of the NAND gate 65, respectively. The second control signal CNT2 is connected to a gate of the PMOS transistor P63.

A drain of the NMOS transistor N61 is connected to the output terminal O7 of the NAND gate 65, and the data signal DATA is connected to a gate of the NMOS transistor N61. A drain of the NMOS transistor N62 is connected to the source of the NMOS transistor N61, and the first control signal CNT1 is connected to a gate of the NMOS transistor N62. A drain of the NMOS transistor N63 is connected to the source of the NMOS transistor N62, and the second control signal CNT2 and the reference voltage VSS are connected to a gate and source of the NMOS transistor N63, respectively.

The NOR gate 67 includes PMOS transistors P66 through P68 and NMOS transistors N66 through N70. The supply voltage VDD and the data signal DATA are connected to a source and gate of the PMOS transistor P66, respectively. A source of the PMOS transistor P67 is connected to a drain of the PMOS transistor P66, and the inverse CNT1B of the first control signal CNT1 is connected to a gate of the PMOS transistor P67. A source and drain of the PMOS transistor P68 are connected to a drain of the PMOS transistor P67 and the output terminal O8 of the NOR gate 67, respectively. The inverse CNT2B of the second control signal CNT2 is connected to a gate of the PMOS transistor P68.

A drain of the NMOS transistor N66 is connected to the output terminal O8 of the NOR gate 67, and the data signal DATA is connected to a gate of the NMOS transistor N66. A drain of the NMOS transistor N67 is connected to the output terminal O8 of the NOR gate 67, and the inverse CNT1B of the first control signal CNT1 is connected to a gate of the NMOS transistor N67. A drain of the NMOS transistor N68 is connected to the output terminal O8 of the NOR gate 67, and the inverse CNT2B of the second control signal CNT2 is connected to a gate of the NMOS transistor N68. A drain of the NMOS transistor N69 is connected to sources of the NMOS transistors N66 through N68, and the supply voltage VDD is connected to a gate of the NMOS transistor N69. A drain of the NMOS transistor N70 is connected to a source of the NMOS transistor N69, and the supply voltage VDD and the reference voltage VSS are connected to a gate and source of the NMOS transistor N70, respectively.

As discussed above, an output buffer circuit according to fourth embodiments of the present invention may include three PMOS transistors along a path between the supply voltage VDD and the output terminal O7 of the NAND gate 65 and may include three PMOS transistors along a path between the supply voltage VDD and the output terminal O8 of the NOR gate 67. In other words, a number of PMOS transistors connected in series between the supply voltage VDD and the output terminal O7 of the NAND gate 65 may be equivalent to a number of PMOS transistors connected in series between the supply voltage VDD and the output terminal O8 of the NOR gate 67.

Also, three NMOS transistors may be present along a path between the reference voltage VSS and the output terminal O7 of the NAND gate 65, and three NMOS transistors may also be present along a path between the reference voltage VSS and the output terminal O8 of the NOR gate 76. In other words, a number of NMOS transistors connected in series between the output terminal O7 of the NAND gate 65 and a reference voltage VSS may be equivalent to a number of NMOS transistors connected in series between the output terminal O8 of the NOR gate 67 and the reference voltage VSS.

Accordingly, sizes (i.e. channel widths) of PMOS transistors in the NAND gate 65 can be fabricated to be the same as sizes of PMOS transistors in the NOR gate 67. Further, sizes (i.e. channel widths) of NMOS transistors in the NAND gate 65 can be the same as those of NMOS transistors in the NOR gate 67. As a result, it may be possible to maintain an input capacitance of the NAND gate 65 to be approximately equivalent to that of the NOR gate 67. Thus, even if there are changes in PVT in an output buffer circuit according to fourth embodiments of the present invention, characteristics of the NAND gate 65 can be maintained approximately the same as those of the NOR gate 67, thereby reducing an occurrence of skew of data output via the output pin DQ.

Figure 7:
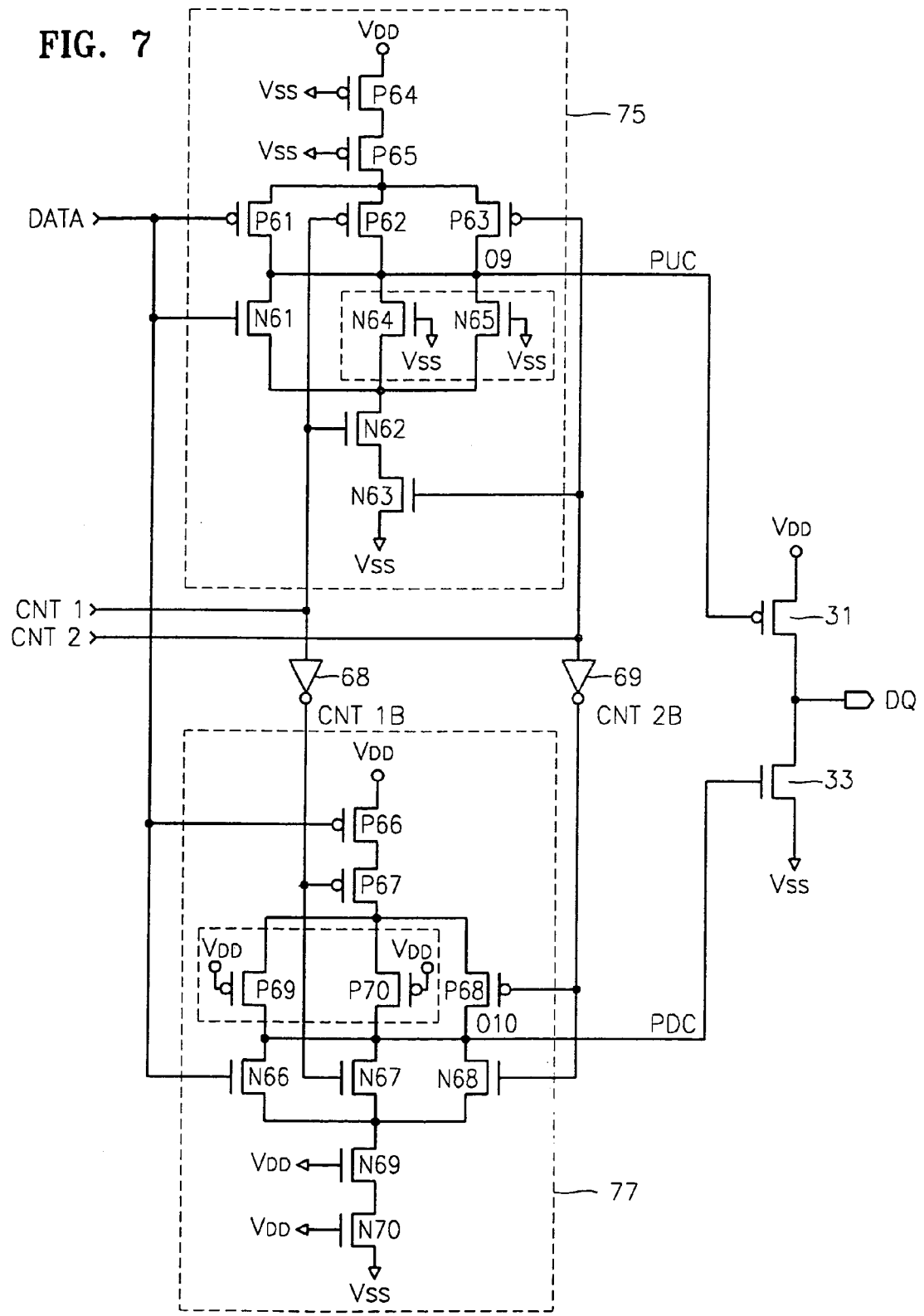
FIG. 7 is a circuit diagram of an output buffer circuit which receives two control signals according to fifth embodiments of the present invention.

FIG. 7 is a circuit diagram of an output buffer circuit which receives two control signals CNT1 and CNT2, according to fifth embodiments of the present invention. A NAND gate 75 of FIG. 7 includes an NMOS transistor N64 and an NMOS transistor N65 in addition to transistors P61, P62, P63, P64, P65, N61, N62 and N63 discussed above with respect to FIG. 6. A drain of NMOS transistor N64 is connected to an output terminal O9 of the NAND gate 75, and a source of NMOS transistor N64 is connected to a source of an NMOS transistor N61. A drain of the NMOS transistor N65 is connected to an output terminal O9 of the NAND gate 75 and a source of the NMOS transistor N65 is connected to the source of the NMOS transistor N61. Gates of both NMOS transistors N64 and N65 are connected to the reference voltage VSS.

A NOR gate 77 of FIG. 7 includes a PMOS transistor P69 and a PMOS transistor P70 in addition to transistors P66, P67, P68, N66, N67, N68, N69, and N70 discussed above with respect to FIG. 6. A source and drain of PMOS transistor P69 are connected to a drain of a PMOS transistor P67 and an output terminal O10 of the NOR gate 77, respectively. Supply voltage VDD is connected to a gate of the PMOS transistor P69. A source and drain of PMOS transistor P70 are connected to the drain of the PMOS transistor P67 and the output terminal O10 of the NOR gate 77, respectively. The supply voltage VDD is connected to a gate of the PMOS transistor P70.

Accordingly, in an output buffer circuit according to fifth embodiments of the present invention, three PMOS transistors are connected to the output terminal O9 of the NAND gate 75 and similarly, three PMOS transistors are connected to the output terminal O10 of the NOR gate 77. Also, three NMOS transistors are connected to the output terminal O9 of the NAND gate 75 and similarly, three NMOS transistors are connected to the output terminal O10 of the NOR gate 77. Inner nodes of the NAND gate 75 may have approximately the same capacitances as those of the NOR gate 77.

As a result, a capacitance of the output terminal O9 of the NAND gate 75 is approximately equivalent to a capacitance of the output terminal O10 of the NOR gate 77. Therefore, in an output buffer circuit according to fifth embodiments of the present invention, characteristics of the NAND gate 75 and the NOR gate 75 can be improved with the addition of transistors N64, N65, P69, and P70.

Figure 8:
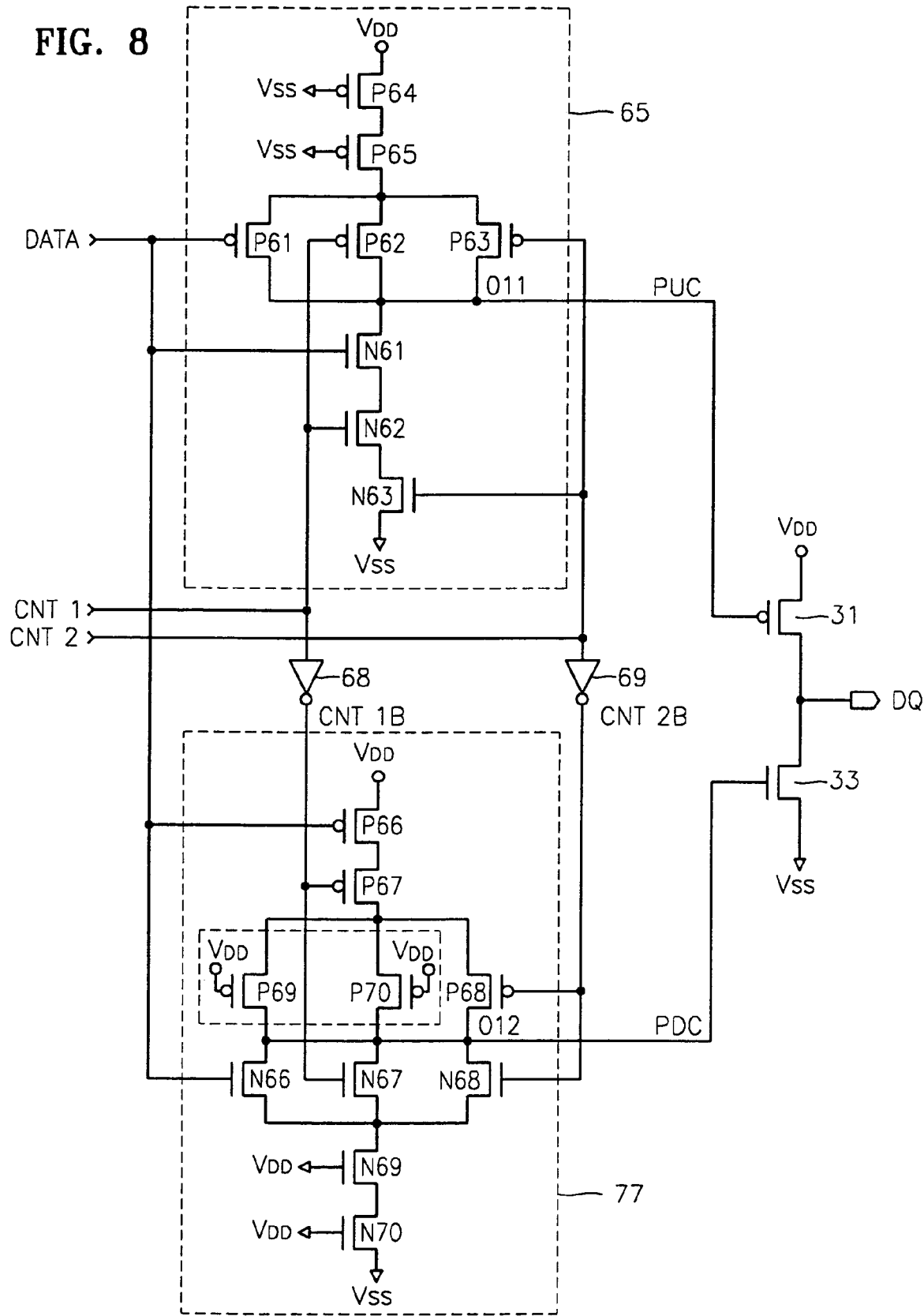
FIG. 8 is a circuit diagram of an output buffer circuit which receives two control signals according to sixth embodiments of the present invention.

FIG. 8 is a circuit diagram of an output buffer circuit which receives two control signals CNT1 and CNT2, according to sixth embodiments of the present invention. Referring to FIG. 8, an output buffer circuit according to the sixth embodiments of the present invention includes a NAND gate 65 having a same construction as the NAND gate 65 of FIG. 6 and a NOR gate 77 having a same construction as the NOR gate 77 of FIG. 7.

In an output buffer circuit according to sixth embodiments of the present invention, three PMOS transistors are connected to an output terminal O11 of the NAND gate 65 and three PMOS transistors are connected to an output terminal O12 of the NOR gate 77. However, one NMOS transistor is connected to the output terminal O11 of the NAND gate 65 while three NMOS transistors are connected to the output terminal O12 of the NOR gate 77.

In an output buffer circuit according to sixth embodiments of the present invention, sizes (i.e. channel widths) of PMOS transistors P69 and P70 may be adjusted to make the capacitance of the output terminal O11 of the NAND gate 65 approximately equivalent to that of the output terminal O12 of the NOR gate 77. For instance, if a size (i.e. channel width) of each of PMOS transistors P61, P62, P63, and P68 is 20 μm and a size (i.e. channel width) of each of NMOS transistors N61, N66, N67, and N68 is 8 μm, a size (i.e. channel width) of each of the PMOS transistors P69 and P70 may be determined to be 12 μm. Further, it is possible that the functionality of PMOS transistors P69 and P70 may be provided by a single layer PMOS transistor. In this case, the size (i.e. channel width) of the single layer PMOS transistor may be equal to the sum of the sizes (i.e. channel width) of the PMOS transistors P69 and P70. More particularly, a single layer PMOS transistor having a size of 24 μm may be substituted for the transistors P69 and P70 of FIG. 8.

An output buffer circuit according to sixth embodiments of the present invention may have approximately the same effects as an output buffer circuit according to fifth embodiments of the present invention.

In this disclosure, embodiments of the present invention have been described with respect to an output buffer circuit that drives an output pin. Embodiments of the present invention may also be applicable to buffer circuits included internally within a semiconductor device.

While the present invention has been particularly shown and described with reference to embodiments thereof, it will be understood by those skilled in the art that various changes in form and details may be made therein without departing from the spirit and scope of the invention as defined by the appended claims and their equivalents.

As described above, even if there are changes in process, voltage, and/or temperature (PVT), the characteristics of a NAND gate can be maintained to be approximately equivalent to those of a NOR gate in an output buffer circuit according to embodiments of the present invention. Accordingly an occurrence of skew of data output via an output pin may be reduced.

What is claimed is:

1. A buffer circuit comprising;
   an output terminal;
   a pull-up transistor connected between the output terminal and a supply voltage, wherein the pull-up transistor pulls the output terminal up to the supply voltage responsive to a pull-up control signal;
   a pull-down transistor connected between the output terminal and a reference voltage, wherein the pull-down transistor pulls the output terminal down to the reference voltage responsive to a pull-down control signal;
   a first logic gate configured to generate the pull-up control signal at a first output node responsive to a control signal and a data signal, and wherein the first logic gate includes a plurality of serially connected transistors in an electrical path between the supply voltage and the first output node; and a second logic gate configured to generate the pull-down control signal at a second output node responsive to the data signal and an inverse of the control signal and wherein the second logic gate includes a plurality of serially connected transistors in a path between the supply voltage and the second output node;

wherein the number of serially connected transistors in the path between the supply voltage and the first output node is equivalent to the number of serially connected transistors in the path between the supply voltage and the second output node;

wherein the plurality of serially connected transistors in the electrical path between the supply voltage and the first output node comprises a first transistor having a first control electrode connected to the data signal and a second transistor coupled in series between the supply voltage and the first transistor, the first logic gate further comprising a third transistor connected in parallel with the first transistor between the second transistor and the first output node, wherein the third transistor has a third control electrode connected to the control signal.

2. A buffer circuit according to claim 1 wherein each of the first, second, and third transistors have a same conductivity type.

3. A buffer circuit according to claim 1 wherein the first transistor is a first PMOS transistor, wherein the second transistor is a second PMOS transistor, and wherein the third transistor is a third PMOS transistor.

4. A buffer circuit according to claim 3 wherein the plurality of serially connected transistors in the path between the supply voltage and the second output node are PMOS transistors.

5. A buffer circuit according to claim 3, the first logic gate further comprising a plurality of serially connected NMOS transistors between the first output node and the reference voltage, the plurality of serially connected NMOS transistors including a first NMOS transistor having a first NMOS control electrode connected to the data signal and a second NMOS transistor having a second NMOS control electrode connected to the control signal.

6. A buffer circuit according to claim 5, the first logic gate further comprising a third NMOS transistor connected in parallel with the first NMOS transistor between the first output node and the second NMOS transistor, the third NMOS transistor having a third NMOS control electrode connected to the reference voltage.

7. A buffer circuit according to claim 1 wherein the first and second logic gates are further responsive to a second control signal, the first logic gate further comprising a fourth transistor connected in parallel with the first and third transistors between the second transistor and the first output node, the fourth transistor having a control electrode connected to the second control signal.

8. A buffer circuit according to claim 7, the first logic gate further comprising a fifth transistor connected in series with the second transistor between the first transistor and the supply voltage.

9. A buffer circuit according to claim 1 wherein the reference voltage comprises a ground voltage.

10. A buffer circuit according to claim 1 wherein the first logic gate comprises a NAND gate and wherein the second logic gate comprises a NOR gate.

11. A buffer circuit according to claim 1 wherein the plurality of serially connected transistors in the path between the supply voltage and the first output node are PMOS transistors, and wherein the plurality of serially connected transistors in the path between the supply voltage and the second output node are PMOS transistors.

12. An output buffer comprising;
an output terminal;
a pull-up transistor connected between the output terminal and a supply voltage, wherein the pull-up transistor pulls the output terminal up to the supply voltage responsive to a pull-up control signal;
a pull-down transistor connected between the output terminal and a reference voltage, wherein the pull-down transistor pulls the output terminal down to the reference voltage responsive to a pull-down control signal;
a first logic gate configured to generate the pull-up control signal at a first output node responsive to a control signal and a data signal, and wherein the first logic gate includes a plurality of serially connected transistors in a path between the first output node and the reference voltage; and
a second logic gate configured to generate the pull-down control signal at a second output node responsive to the data signal and an inverse of the control signal and wherein the second logic gate includes a plurality of serially connected transistors in a path between the second output node and the reference voltage;

wherein the number of serially connected transistors in the path between the first output node and the reference voltage is equivalent to the number of serially connected transistors in the path between the second output node and the reference voltage;

wherein the plurality of serially connected transistors in the electrical path between the second output node and the reference voltage comprises a first transistor having a first control electrode connected to the data signal and a second transistor connected in series between the first transistor and the reference voltage, the second logic gate further comprising a third transistor connected in parallel with the first transistor between the second transistor and the second output node, wherein the third transistor has a control electrode connected to the inverse of the control signal.

13. A buffer circuit according to claim 12 wherein each of the first, second and third transistors have a same conductivity type.

14. A buffer circuit according to claim 12 wherein the first transistor is a first NMOS transistor, wherein the second transistor is a second NMOS transistor, and wherein the third transistor is a third NMOS transistor.

15. A buffer circuit according to claim 14 wherein the plurality of serially connected transistors in the path between the first output node and the reference voltage are NMOS transistors.

16. A buffer circuit according to claim 14, the second logic gate further comprising a plurality of serially connected PMOS transistors between the supply voltage and the second output node, the plurality of serially connected PMOS transistors including a first PMOS transistor having a first PMOS control electrode connected to the data signal and a second PMOS transistor having a second PMOS control electrode connected to the inverse of the control signal.

17. A buffer circuit according to claim 16, the second logic gate further comprising a third PMOS transistor connected in parallel with the first PMOS transistor between the second PMOS transistor and the second output node, the third PMOS transistor having a third PMOS control electrode connected to the supply voltage.

18. A buffer circuit according to claim 12 wherein the first and second logic gates are further responsive to a second control signal, the second logic gate further comprising a fourth transistor connected in parallel with the first and third transistors between the second transistor and the second output node, the fourth transistor having a control electrode connected to an inverse of the second control signal.

19. A buffer circuit according to claim 18, the second logic gate further comprising a fifth transistor connected in series with the second transistor between the first transistor and the reference voltage.

20. A buffer circuit according to claim 12 wherein the reference voltage comprises a ground voltage.

21. A buffer circuit according to claim 12 wherein the first logic gate comprises a NAND gate and wherein the second logic gate comprises a NOR gate.

22. A buffer circuit according to claim 12 wherein the plurality of serially connected transistors in the path between the first output node and the reference voltage are NMOS transistors, and wherein the plurality of serially connected transistors in the path between the second output node and the reference voltage are NMOS transistors.

23. An output buffer circuit comprising:
a pull-up transistor which pulls up an output terminal in response to a pull-up control signal;
a pull-down transistor which pulls down the output terminal in response to a pull-down control signal;
a NAND gate which receives at least one control signal and data and generates the pull-up control signal; and
a NOR gate which receives an inverted signal of the control signal and the data and generates the pull-down control signal, wherein a number of PMOS transistors present along a path of a first supply voltage to an output terminal of the NAND gate is equivalent to a number of PMOS transistors present along a path of the first supply voltage to an output terminal of the NOR gate, and a number of NMOS transistors present along a path of a second supply voltage to an output terminal of the NAND gate is equivalent to a number of NMOS transistors present along a path of the second supply voltage to an output terminal of the NOR gate;
wherein the NAND gate comprises,
a first PMOS transistor which has a source to which the first supply voltage is applied and a gate to which the second supply voltage is applied,
a second PMOS transistor which has a source connected to a drain of the first PMOS transistor, a gate to which the data is input, and a drain connected to the output terminal of the NAND gate,
a third PMOS transistor which has a source connected to the drain of the first PMOS transistor, a gate to which the control signal is applied, and a drain connected to the output terminal of the NAND gate,
a first NMOS transistor which has a drain connected to the output terminal of the NAND gate and a gate to which the data is input, and
a second NMOS transistor which has a drain connected to a source of the first NMOS transistor, a gate to which the control signal is applied, and a source to which the second supply voltage is applied.

24. An output buffer circuit comprising:
a pull-up transistor which pulls up an output terminal in response to a pull-up control signal;
a pull-down transistor which pulls down the output terminal in response to a pull-down control signal;
a NAND gate which receives at least one control signal and data and generates the pull-up control signal; and
a NOR gate which receives an inverted signal of the control signal and the data and generates the pull-down control signal, wherein a number of PMOS transistors present along a path of a first supply voltage to an output terminal of the NAND gate is equivalent to a number of PMOS transistors present along a path of the first supply voltage to an output terminal of the NOR gate, and a number of NMOS transistors present along a path of a second supply voltage to an output terminal of the NAND gate is equivalent to a number of NMOS transistors present along a path of the second supply voltage to an output terminal of the NOR gate:
wherein the NOR gate includes,
a first PMOS transistor which has a source to which the first supply voltage is applied and a gate to which the inverted signal of the control signal is applied,
a second PMOS transistor which has a source connected to a drain of the first PMOS transistor, a gate to which the data is input, and a drain connected to the output terminal of the NOR gate,
a first NMOS transistor which has a drain connected to the output terminal of the NOR gate and a gate to which the inverted signal of the control signal is applied,
a second NMOS transistor which has a drain connected to the output terminal of the NOR gate and a gate to which the data is input, and
a third NMOS transistor which has a drain connected to sources of the first and second NMOS transistors, a gate to which the first supply voltage is applied, and a source to which the second supply voltage is applied.

25. The output buffer circuit of claim 23, wherein the NAND gate further comprises a third NMOS transistor which has a drain connected to the output terminal of the NAND gate, a gate to which the second supply voltage is applied, and a source connected to the source of the first NMOS transistor.

26. The output buffer circuit of claim 23, wherein the NOR gate further comprises a third PMOS transistor which has a source connected to the drain of the first PMOS transistor, a gate to which the first supply voltage is applied, and a drain connected to the output terminal of the NOR gate.

27. An output buffer circuit comprising:
a pull-up transistor which pulls up an output terminal in response to a pull-up control signal;
a pull-down transistor which pulls down the output terminal in response to a pull-down control signal;
a NAND gate which receives at least one control signal and data and generates the pull-up control signal; and
a NOR gate which receives an inverted signal of the control signal and the data and generates the pull-down control signal,
wherein a number of PMOS transistors present along a path of a first supply voltage to an output terminal of the NAND gate is equivalent to a number of PMOS transistors present along a path of the first supply voltage to an output terminal of the NOR gate, and a number of NMOS transistors present along a path of a second supply voltage to an output terminal of the NAND gate is equivalent to a number of NMOS transistors present along a path of the second supply voltage to an output terminal of the NOR gate;

wherein the NAND gate comprises,
a first PMOS transistor which has a source to which the first supply voltage is applied and a gate to which the second supply voltage is applied,
a second PMOS transistor which has a source connected to the drain of the first PMOS transistor and a gate to which the second supply voltage is applied,
a third PMOS transistor which has a source connected to the drain of the second PMOS transistor, a gate to which the data is input, and a drain connected to the output terminal of the NAND gate,
a fourth PMOS transistor which has a source connected to the drain of the second PMOS transistor, a gate to which a first control signal is applied, and a drain connected to the output terminal of the NAND gate,
a fifth PMOS transistor which has a source connected to the drain of the second PMOS transistor, a gate to which a second control signal is applied, and a drain connected to the output terminal of the NAND gate,
a first NMOS transistor which has a drain connected to the output terminal of the NAND gate and a gate to which the data is input,
a second NMOS transistor which has a drain connected to a source of the first NMOS transistor and a gate to which the first control signal is applied, and
a third NMOS transistor which has a drain connected to a source of the second NMOS transistor, a gate to which the second control signal is applied, and a source to which the second supply voltage is applied.

28. An output buffer circuit comprising:
a pull-up transistor which pulls up an output terminal in response to a pull-up control signal;
a pull-down transistor which pulls down the output terminal in response to a pull-down control signal;
a NAND gate which receives at least one control signal and data and generates the pull-up control signal; and
a NOR gate which receives an inverted signal of the control signal and the data and generates the pull-down control signal,
wherein a number of PMOS transistors present along a path of a first supply voltage to an output terminal of the NAND gate is equivalent to a number of PMOS transistors present along a path of the first supply voltage to an output terminal of the NOR gate, and a number of NMOS transistors present along a path of a second supply voltage to an output terminal of the NAND gate is equivalent to a number of NMOS transistors present along a path of the second supply voltage to an output terminal of the NOR gate;
wherein the NOR gate comprises,
a first PMOS transistor which has a source to which the first supply voltage is applied and a gate to which the data is input,
a second PMOS transistor which has a source connected to a drain of the first PMOS transistor and a gate to which an inverted signal of the first control signal is applied,
a third PMOS transistor which has a source connected to a drain of the second PMOS transistor, a gate to which an inverted signal of the second control signal is applied, and a drain connected to the output terminal of the NOR gate,
a first NMOS transistor which has a drain connected to the output terminal of the NOR gate and a gate to which the data is input,
a second NMOS transistor which has a drain connected to the output terminal of the NOR gate and a gate to which an inverted signal of the first control signal is applied,
a third NMOS transistor which has a drain connected to the output terminal of the NOR gate and a gate to which an inverted signal of the second control signal is applied,
a fourth NMOS transistor which has a drain connected to sources of the first through third NMOS transistors and a gate to which the first supply voltage is applied, and
a fifth NMOS transistor which has a drain connected to a source of the fourth NMOS transistor, a gate to which the first supply voltage is applied, and a source to which the second supply voltage is applied.

29. The output buffer circuit of claim 27, wherein the NAND gate comprises a fourth NMOS transistor which has a drain connected to the output terminal of the NAND gate, a gate to which the second supply voltage is applied, and a source connected to the source of the first NMOS transistor; and
a fifth NMOS transistor which has a drain connected to the output terminal of the NAND gate, a gate to which the second supply voltage is applied, and a source connected to the source of the first NMOS transistor.

30. The output buffer circuit of claim 28, wherein the NOR gate further comprises:
a fourth PMOS transistor which has a source connected to the drain of the second PMOS transistor, a gate to which the first supply voltage is applied, and a drain connected to the output terminal of the NOR gate; and
a fifth PMOS transistor which has a source connected to the drain of the second PMOS transistor, a gate to which the first supply voltage is applied, and a drain connected to the output terminal of the NOR gate.

* * * * *